United States Patent
Konno

[11] Patent Number: 5,914,516
[45] Date of Patent: Jun. 22, 1999

[54] BUFFER CIRCUIT WITH WIDE GATE INPUT TRANSISTOR

[75] Inventor: Hideki Konno, Tokyo, Japan

[73] Assignee: Mitsubishi Denki Kabushiki Kaisha, Tokyo, Japan

[21] Appl. No.: 08/841,642

[22] Filed: Apr. 30, 1997

[30] Foreign Application Priority Data

Sep. 6, 1996 [JP] Japan ..................... 8-236189

[51] Int. Cl.⁶ .................................. H01L 23/62
[52] U.S. Cl. .......................... 257/357; 257/206
[58] Field of Search .................. 257/355, 356, 257/357, 365, 202, 204, 206, 207, 203

[56] References Cited

U.S. PATENT DOCUMENTS 5,367,187  11/1994  Yuen ........................ 257/206
5,486,716  1/1996  Saito et al. .

FOREIGN PATENT DOCUMENTS 59-208771  11/1984  Japan .

*Primary Examiner*—David B. Hardy
*Attorney, Agent, or Firm*—Leydig, Voit & Mayer, Ltd.

[57] ABSTRACT

In a semiconductor integrated circuit including an input-stage input buffer circuit, an input terminal of the input buffer circuit is connected to a gate of an input MOS transistor which has a gate length longer than a gate length specified in the applied design rule. Alternatively, in a gate array system of a semiconductor integrated circuit, a number of gates have a gate length longer than the length specified in an applied design rule. An input transistor of the input buffer circuit has gate with a gate length longer than a gate length specified in the applied design rule.

11 Claims, 4 Drawing Sheets

BUFFER CIRCUIT WITH WIDE GATE INPUT TRANSISTOR

BACKGROUND OF THE INVENTION

1. Field of the Invention

The present invention relates to a semiconductor integrated circuit having an improved surge protection function at an input stage. The present invention particularly relates to an improvement in the input stage of an input buffer circuit in a semiconductor integrated circuit comprising a gate array system.

2. Description of the Background Art

Since semiconductor devices are ever advancing in integration, and size is decreasing, electrostatic breakdown becomes an important problem particularly in MOS devices, because MOS devices have a particularly high input impedance. Static electricity in a semiconductor device is subject to temperature and humidity, and generally decreases as temperature rises or humidity increases. Static electricity is particularly influenced by humidity. When relative humidity is 40 to 50% or less, static electricity increases dramatically.

Breakdown of a chip due to static electricity is roughly divided into three modes. The first mode is fusion of an internal lead, e.g., aluminum or polysilicon, the second mode is breakdown of an oxide film, and the third mode is breakdown of a junction. Fusion of a wire lead such as gold wire or thin aluminum wire may occur together with the above breakdown of a chip.

The three modes frequently appear in combination. On the other hand, in case of a slight damage, no trouble is detectable from the appearance of the chip, but leakage current of a junction may increase or the amplification factor of a transistor may decrease. Therefore, in case of an MOS device, a surge protection circuit is generally provided in an input buffer circuit to protect internal circuits from static electricity.

FIG. 5 shows a circuit diagram of an input stage of a conventional semiconductor integrated circuit. In the conventional input stage circuit shown in FIG. 5, an input pad 1 receives an input signal. The input signal is then transferred to an input buffer circuit 2 via a resistance element 11. The input buffer circuit 2 is comprised of a P-channel MOS transistor 6 and an N-channel MOS transistor 8 connected in series between a power-supply potential node 4 and an earth potential node 7. Each gate of the transistors 6 and 8 is connected at an input node 3. Each internal wiring 9 and 10 is connected respectively to the input node 3 and an output node 5 of the input buffer circuit 2.

A first diode 12 is connected between the input pad 1 and the power-supply potential node 4. A second diode 13 is connected between the input pad 1 and the earth potential node 7. Each diode 12 and 13 is comprised of an off-state P-channel or N-channel MOS transistor with its source and gate short-circuited. The resistance element 11, the first diode 12, and the second diode 13 work as a surge protection circuit.

FIG. 6 is a layout diagram of the input-stage input buffer circuit 2 shown in FIG. 5. In the case of a CMOS gate array as shown in FIG. 6, the P-channel MOS transistor 6 comprises gates 6a and 6b made of polysilicon and connected to the power-supply potential node 4, a gate 6c made of polysilicon and disposed between the gates 6a and 6b, a P-type drain region 6d formed at the surface of a semiconductor substrate between the gates 6a and 6c, and a P-type source region 6e at the surface of the semiconductor substrate between the gates 6b and 6c.

Further, as shown in FIG. 6, the N-channel MOS transistor 8 comprises gates 8a and 8b made of polysilicon and connected to the earth potential node 7, a gate 8c made of polysilicon disposed between the gates 8a and 8b, an N-type drain region 8d at the surface of the semiconductor substrate between the gates 8a and 8c, and an N-type source region 8e at the surface of the semiconductor substrate between the gates 8b and 8c.

The gate 6c of the P-channel MOS transistor 6 is connected with the gate 8c of the N-channel MOS transistor 8 by an aluminum wiring 3a on each gate 6c and 8c. The wiring 3a corresponds to the input node 3 in FIG. 5.

In operation of the circuit shown in FIGS. 5 and 6, when a surge equal to or higher than a power supply voltage is applied from the input pad 1, the surge flows to the power supply through the first diode 12. When a surge equal to or lower than a ground potential is applied from the input pad 1, then the surge flows to the ground through the second diode 13.

FIG. 7 is a circuit diagram showing another input circuit means of a conventional semiconductor integrated circuit disclosed in Japanese Patent Application Laid-Open No. 59-208771. In FIG. 7, two transistors 14a and 14b are connected to the input pad 1 of the input buffer circuit 2 of the input stage of a semiconductor integrated circuit. The two transistors 14a and 14b have structures similar to the first diode 12 and the second diode 13 as shown in FIG. 5, and have a surge protection function. The other reference numerals in FIG. 7 refer to the same or similar elements as shown in FIG. 5, so that a detailed description is omitted.

The surge protection circuit of the input buffer circuit in the input stage of a conventional semiconductor circuit is constructed as described in FIG. 5 or FIG. 7. In those semiconductor integrated circuit devices, transistors which are not used in the input buffer circuit in an input stage are connected to an input pad capacitively or through a diode. Thus, a certain level of surge protection is attained. However, a surge protection circuit with higher surge protection function for higher surge voltage and with reduced area on a semiconductor chip is demanded for an input buffer circuit in a input stage of a semiconductor circuit.

SUMMARY OF THE INVENTION

An object of the present invention is to provide a semiconductor integrated circuit which has a better surge protection function without much increase of a specific area of a semiconductor chip used for surge protection.

According to one aspect of the present invention, in a semiconductor integrated circuit comprising an input-stage input buffer circuit, an input terminal of the input buffer circuit is connected to at least one gate of at least one input transistor and other transistors, the input transistor having a gate length larger than lengths of gates of other transistors, the transistors all being located on a single substrate and the gate lengths specified in an applied design rule.

In another aspect of the present invention, in the semiconductor integrated circuit, the transistor is an MOS transistor.

In another aspect of the present invention, in the semiconductor integrated circuit, a gate of another transistor, which is a capacitance element, is connected to the input terminal of the input buffer circuit.

In another aspect of the present invention, in the semiconductor integrated circuit, the other transistor is an MOS transistor.

According to another aspect of the present invention, a semiconductor integrated circuit comprises a gate array system. The gate array system includes a plurality of gates having lengths as specified in an applied design rule. The gate array system further includes a predetermined number of gates having a gate length longer than the length specified in the applied design rule.

In another aspect of the present invention, in a semiconductor integrated circuit comprising a gate array system, an input-stage input buffer circuit is formed in the gate array system. An input transistor of the input buffer circuit has one gate having a gate length longer than a gate length specified in the applied design rule.

In another aspect of the present invention, in a semiconductor integrated circuit comprising a gate array system, another transistor in the gate array system is a capacitance element, and a gate of the capacitance element is connected to the gate of the input transistor.

According to another aspect of the present invention, a semiconductor integrated circuit comprises a cell base gate array system. The cell base gate array system includes a plurality of gates formed in accordance with an applied design rule. The cell base gate array system further includes a predetermined number of gates having a gate length longer than the length specified in the applied design rule.

In another aspect of the present invention, in a semiconductor integrated circuit comprising a cell base gate array system, an input-stage input buffer circuit is included in the cell base gate array system. An input transistor of the input buffer circuit has a gate having a gate length longer than a gate length specified in the applied design rule.

In another aspect of the present invention, in the semiconductor integrated circuit comprising a cell base gate array system, at least one other transistor is a capacitance element in the cell base gate array system, and a gate of the other transistor is connected to the gate of the input transistor.

Other features and advantages of the invention will be apparent from the following description.

BRIEF DESCRIPTION OF THE DRAWINGS

Throughout the drawings, same reference numerals refer to same or like elements.

DETAILED DESCRIPTION OF THE PREFERRED EMBODIMENTS

First embodiment

Figure 1:
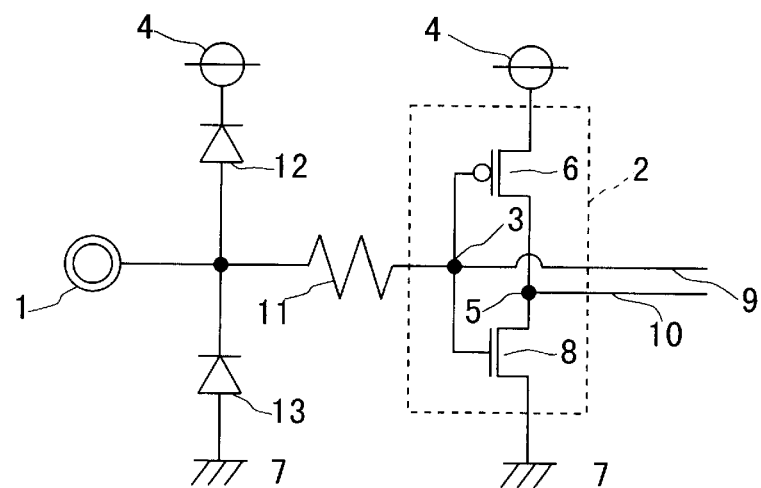
FIG. 1 is a circuit diagram of an input stage including an input buffer circuit of a semiconductor integrated circuit according to a first embodiment of the present invention.
Figure 2:
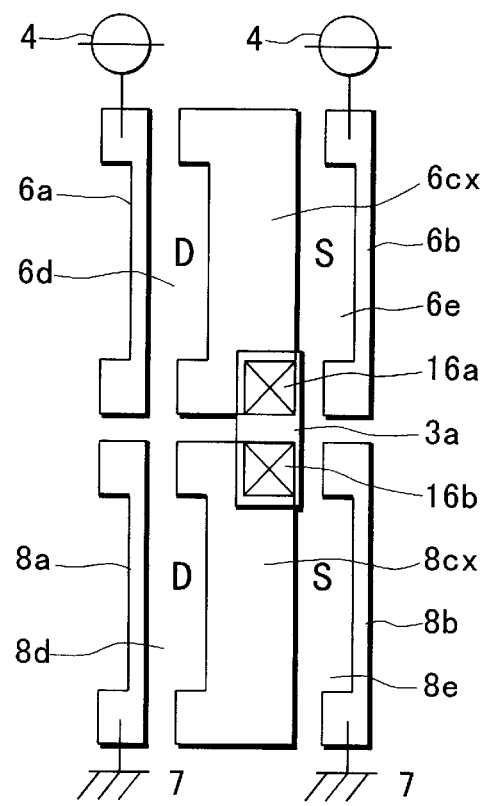
FIG. 2 is a layout diagram in a semiconductor chip of the input-stage input buffer circuit shown in FIG. 1.

A first embodiment of the present invention is described below by referring to FIGS. 1 and 2. FIG. 1 is a circuit diagram of an input stage showing the first embodiment of a semiconductor integrated circuit of the present invention. FIG. 2 is a layout diagram on a semiconductor chip of the input-stage input buffer circuit in FIG. 1.

In the input stage circuit shown in FIG. 1, an input pad 1 is located on a semiconductor substrate, and is connected to a lead terminal through a wire lead, to which an input signal is applied.

An input buffer circuit 2 for an internal circuit receives the input signal from the input pad 1. The input buffer circuit 2 comprises a P-channel MOS transistor 6 and an N-channel MOS transistor 8. The P-channel MOS transistor 6 is connected between a power-supply potential node 4 and an output node 5. The gate of the transistor 6 is connected to an input node 3. The N-channel MOS transistor 8 is connected between an earth potential node 7 and an output node 5. The gate of transistor 8 is connected to the input node 3.

An internal wiring 9 is connected to the input node 3 of the input buffer circuit 2. An internal wiring 10 is connected to the output node 5 of the input buffer circuit 2. A resistance element 11 is connected between the input pad 1 and the input node 3 of the input buffer circuit 2.

A first diode 12 has its anode connected to the input pad 1 and its cathode connected to the power-supply potential node 4. The first diode 12 comprises an off-state P-channel MOS transistor with its source and gate short-circuited. The second diode 13 has its cathode connected to the input pad 1 and its anode connected to the earth potential node 7. The second diode 13 comprises an off-state N-channel MOS transistor with its source and gate short-circuited.

The resistance element 11, the first diode 12, and the second diode 13 constitute a surge protection circuit of the input buffer circuit 2.

In operation of the circuit shown in FIG. 1, when a surge equal to or higher than a power supply voltage is applied from the input pad 1, the surge flows to the power supply through the first diode 12. When a surge equal to or lower than a ground potential is applied from the input pad 1, then the surge flows to the ground through the second diode 13.

Figure 5:
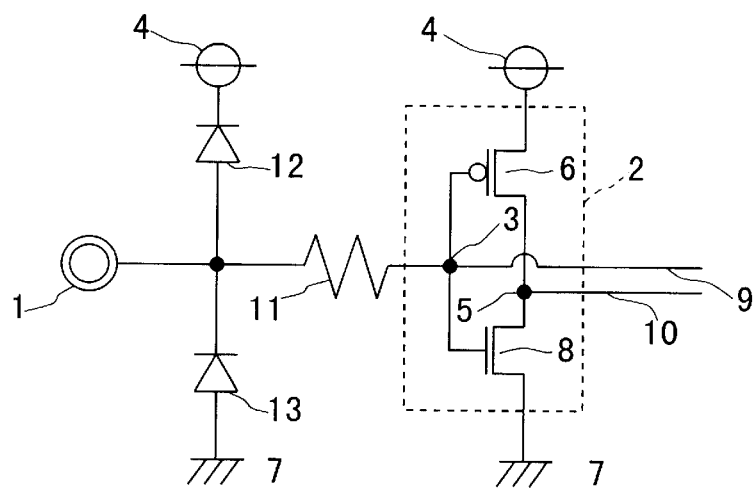
FIG. 5 is a circuit diagram of an input stage of a conventional semiconductor integrated circuit.

In the circuit of the input stage of the first embodiment of a semiconductor integrated circuit of the present invention as shown in FIG. 1, no difference from the circuit diagram, shown in FIG. 5, of the input stage of the conventional semiconductor integrated circuit is seen. However, the difference is clarified by comparing the layout diagram of the input buffer circuit shown in FIG. 2 with the layout diagram of the conventional input buffer circuit shown in FIG. 6.

In the layout diagram of the input buffer circuit using a CMOS gate array as shown in FIG. 2, the P-channel MOS transistor 6 comprises gates 6a and 6b made of polysilicon and connected to the power-supply potential node 4, a gate 6cx made of polysilicon and disposed between the gates 6a and 6b, a P-type drain region 6d at the surface of a semiconductor substrate between the gates 6a and 6cx, and a P-type source region 6e at the surface of the semiconductor substrate between the gates 6b and 6cx.

Further, as shown in FIG. 2, the N-channel MOS transistor 8 comprises gates 8a and 8b made of polysilicon and connected to the earth potential node 7, a gate 8cx made of polysilicon disposed between the gates 8a and 8b, an N-type drain region 8d at the surface of the semiconductor substrate between the gates 8a and 8cx, and an N-type source region 8e at the surface of the semiconductor substrate between the gates 8b and 8cx.

The gate 6cx of the P-channel MOS transistor 6 is connected with the gate 8cx of the N-channel MOS transistor 8 by an aluminum wiring 3a on each gate 6cx and 8cx, and the wiring 3a corresponds to the input node 3 in FIG. 5.

Design rules are used in designing integrated circuits and specify the sizes of transistors and their various parts as well as the sizes of other electrical elements of the integrated circuit. A design rule applied in a particular circuit design specifies a uniform gate electrode length for field effect transistors in the circuit.

Figure 6:
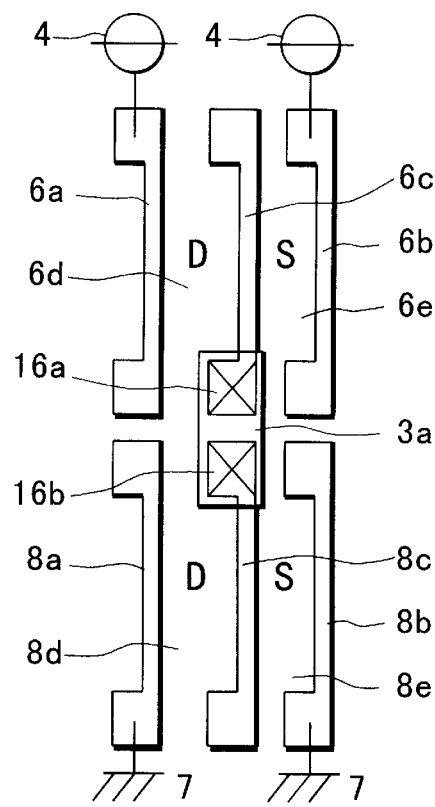
FIG. 6 is a layout diagram of the input-stage input buffer circuit shown in FIG. 5.
Figure 7:
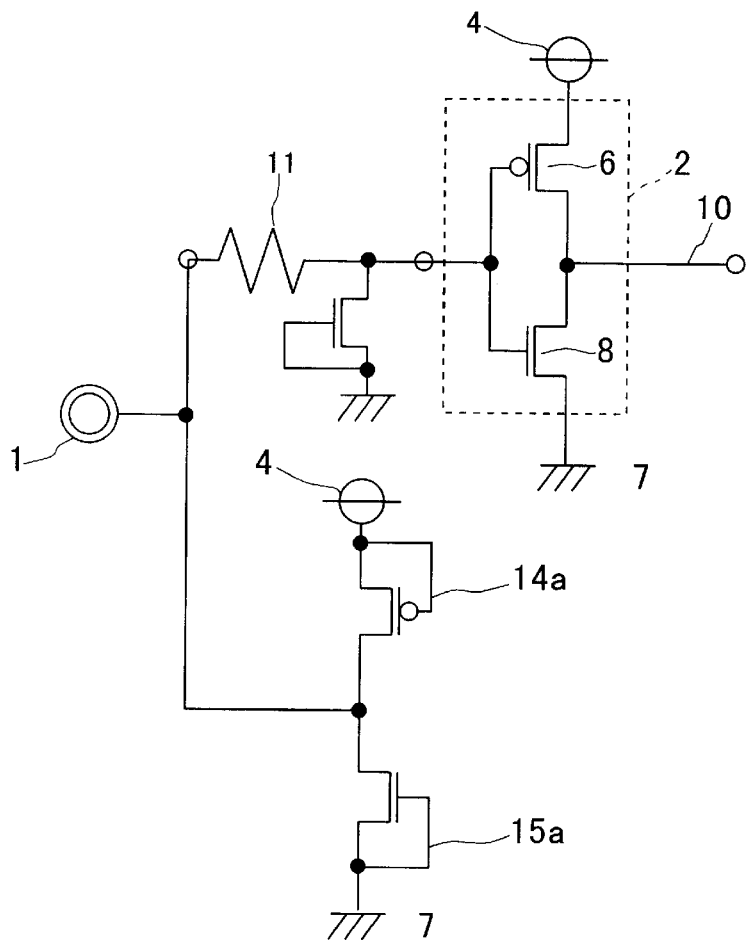
FIG. 7 is a circuit diagram showing another input circuit of a conventional semiconductor integrated circuit.

In contrast to the conventional layout of the input buffer circuit shown in FIG. 6, in the layout of the input buffer circuit of the first embodiment as shown in FIG. 2, the lengths of the input gates 6cx and 8cx of the P-channel MOS transistor 6 and the N-channel MOS transistor 8 are longer than the gate length specified in applied design rule, and the input capacitance of the input-stage input buffer circuit 2 is increased. By contrast, the gates 6a and 6b have lengths corresponding to the applied design rule. Thus, the surge withstand voltage is raised, and the surge protection function is improved as compared to the input buffer circuit of the conventional semiconductor integrated circuit, in which the input gates 6c and 8c of the P-channel MOS transistor 6 and the N-channel MOS transistor 8 have the standard gate length specified in applied design rule as shown in FIG. 6.

Second embodiment

A second embodiment of the present invention is described below referring to FIGS. 3 and 4.

Figure 3:
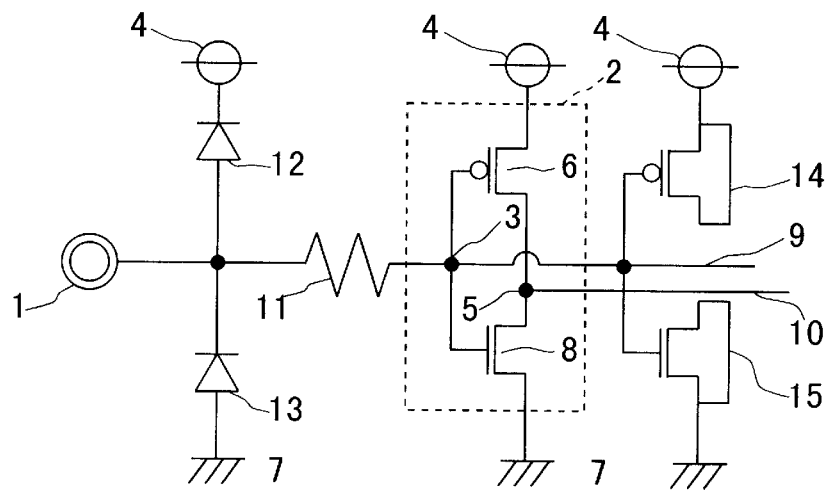
FIG. 3 is a circuit diagram of an input stage including an input buffer circuit of a semiconductor integrated circuit according to a second embodiment of the present invention.

FIG. 3 is a circuit diagram of an input stage showing the second embodiment of a semiconductor integrated circuit of the present invention. FIG. 4 is a layout diagram on a semiconductor chip of the input-stage input buffer circuit included in Figure 3. In FIG. 3 and FIG. 4, reference numerals 1 through 13 indicate the same or corresponding elements with the same reference numerals as in FIGS. 1 and 2.

An input pad 1 receives an input signal. An input buffer circuit 2 of an internal circuit receives the input signal from the input pad via a resistance element 11. The diodes 12 and 13 and the resistance element 11 work as a surge protection circuit. Further description of the construction and operation of the portion of the input stage circuit that is the same as the first embodiment is omitted here.

In the second embodiment, as shown in FIG. 3, a first capacitance element 14 and a second capacitance element 15 are added. The first capacitance element 14 is connected between the input node 3 of the input buffer circuit 2 and the power-supply potential node 4. The second capacitance element 15 is connected between the input node 3 of the input buffer circuit 2 and the earth potential node 7.

The first capacitance element 14 comprises a P-channel MOS transistor whose source and drain are electrically short-circuited to each other. A gate 14a of the first capacitance element 14 is connected to the input node 3 of the input buffer circuit 2, and the source and drain are connected to the power-supply potential node 4.

The second capacitance element 15 comprises an N-channel MOS transistor whose source and drain are electrically short-circuited to each other. A gate 15a of the second capacitance element 15 is connected to the input node 3 of the input buffer circuit 2, and the source and drain are connected to the earth potential node 7.

Figure 4:
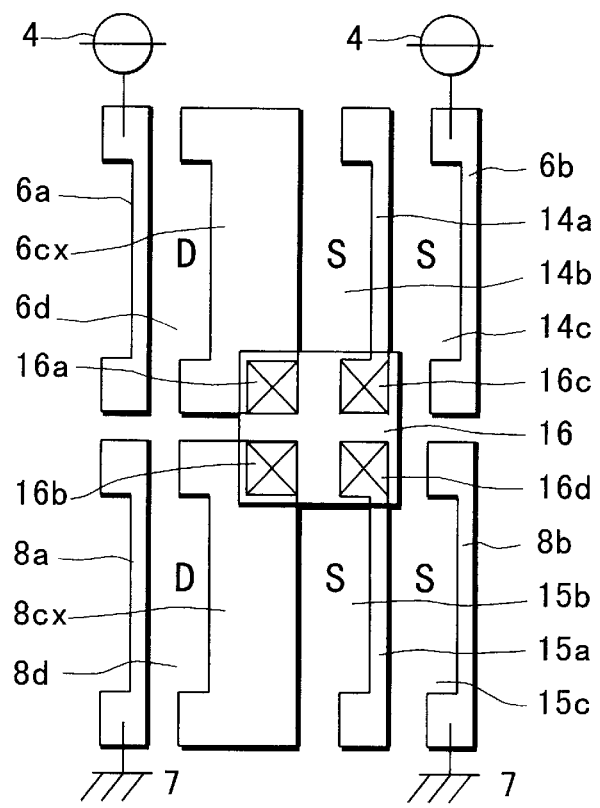
FIG. 4 is a layout diagram in a semiconductor chip of the input-stage input buffer circuit shown in FIG. 3.

FIG. 4 is a layout diagram on a semiconductor chip of the input-stage input buffer circuit included in FIG. 3.

In the layout diagram using a CMOS gate array shown in FIG. 4, the capacitance elements 14 and 15 are connected respectively to the input gates 6cx and 8cx of the P-channel MOS transistor 6 and the N-channel MOS transistor 8 of the input buffer circuit 2.

The MOS transistors 14 and 15 used as the capacitance elements have the standard gate length specified in the applied design rule.

The first capacitance element 14 is arranged together with the P-channel MOS transistor 6, which includes the gates 6a and 6b made of polysilicon and connected to the power-supply potential node 4, and the gate 6cx made of polysilicon and connected to the input node 3.

A gate 14a of the P-channel MOS transistor 14 is disposed between the gates 6cx and 6b. P-type regions 14b and 14c are short-circuited to each other. The short-circuited regions 14b and 14c are connected to the power-supply potential node 4.

The second capacitance element 15 is arranged together with the N-channel MOS transistor 8, which includes the gates 8a and 8b made of polysilicon and connected to the power-supply potential node 4, and the gate 8cx made of polysilicon and connected to the input node 3.

A gate 15a of the P-channel MOS transistor 15 is disposed between the gates 8cx and 8b. N-type regions 15b and 15c are short-circuited to each other. The short-circuited regions 15b and 15c are connected to the earth potential node 7.

An aluminum wiring 16 electrically connects the gate 6cx of the P-channel MOS transistor 6, gate 8cx of the N-channel MOS transistor 8, gate 14a serving as one electrode of the first capacitance element 14, and gate 15a serving as one electrode of the second capacitance element 15 through junctions 16a to 16d, i.e., aluminum layer connections embedded in contact holes. The aluminum wiring 16 serves as the input node 3 of the input buffer circuit 2 shown in FIG. 3.

The operations of the input buffer circuit shown in FIGS. 3 and 4 are as follows. The capacitance of the MOS elements 14 and 15 is added to the input node 3 of the input buffer circuit 2. Therefore, a substantial gate area S of the input buffer circuit 2 is further increased as compared to the first embodiment. Thereby, even when a surge is applied through the input pad 1 in FIG. 3 and an excess voltage is applied to the input node 3, the rise of an electric field between the gate 6cx or 8cx and the source or drain doped regions may be moderated as understood from the following expression, and the surge protection function is improved.

Figure 8:
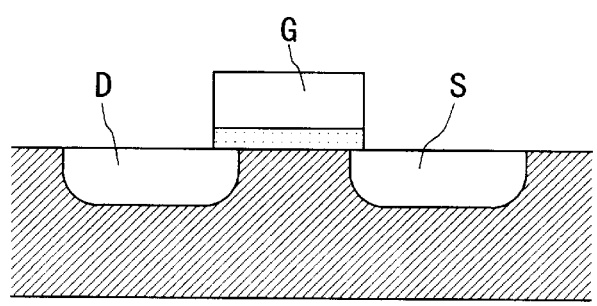
FIG. 8 is a cross sectional view of an MOS transistor for explaining an electric field between a gate electrode and a doped region.

With reference to a general cross-sectional view of an MOS transistor shown in FIG. 8, an electric field E between the gate electrode G and the doped regions S or D is given by the following expression, and decreases with the increased gate area S.

$$E = V/d = Q/Cd = Q/\epsilon S$$

Where, E: Electric field between the gate electrode and the diffusion region, V: Voltage between the gate electrode and the diffusion region, d: Distance between the gate electrode and the doped region, $\epsilon$: Dielectric constant, Q: Electric charge, S: Gate area.

Thus, in the second embodiment, the surge withstand voltage of the input buffer circuit 2 is further raised, and the surge protection function of the input buffer circuit 2 is improved by combining the structure of the first embodiment with the capacitance elements 14 and 15.

Third embodiment

The third embodiment of the present invention is described below referring to FIGS. 1 through 4.

According to a third embodiment of the present invention, in a semiconductor integrated circuit comprising a gate array system, a predetermined number of transistors, having gate lengths longer than that specified in the applied design rule, such as the transistors 6 and 8 shown in FIGS. 1 and 2, are formed in a gate array master together with a plurality of transistors having the standard gate length specified in the applied design rule. An input-stage input buffer circuit includes a transistor or transistors having a gate length longer than that specified in the applied design rule.

Alternatively, in accordance with a demand for a particular surge withstand voltage, a transistor or transistors having the standard gate length specified in the applied design rule may be added to the input gate of the input transistor of the input-stage input buffer circuit as an MOS capacitance as shown in FIGS. 3 and 4.

Thus, an input buffer circuit may be easily constructed corresponding to the demand for different surge withstand voltages.

Fourth embodiment

The fourth embodiment of the present invention is described below by referring to FIGS. 1 through 4.

According to a fourth embodiment of the present invention, in a semiconductor integrated circuit on a cell base comprising a gate array system, a predetermined number of transistors, having gate lengths longer than that specified in the applied design rule such as the transistors 6 and 8 shown in FIGS. 1 and 2, are formed in the standard cells together with a plurality of transistors having the standard gate length specified in the applied design rule. An input-stage input buffer circuit is constituted by using a transistor or transistors having a gate length longer than that specified in the applied design rule.

Alternatively, in accordance with a request for a particular surge withstand voltage, a transistor or transistors having the standard gate length specified in the applied design rule may be added to the input gate of the input transistor of the input-stage input buffer circuit as an MOS capacitance as shown in FIGS. 3 and 4.

Thus, an input buffer circuit in a semiconductor integrated circuit on a cell base gate array system may be easily constructed corresponding to the demand for different surge withstand voltages. The area of a semiconductor chip of the input buffer circuit having surge protection may be minimized, and the surge protection function may be optimized.

According to the present invention as described above, the following advantages are obtained.

In the present invention, an input-stage input buffer circuit of a semiconductor integrated circuit includes a transistor having a gate length longer than that specified in the applied design rule. Thereby, surge withstand voltage of a surge protection circuit is raised, and surge protection performance is improved, while an increase in the area occupied by the surge protection circuit on a chip is controlled.

In the present invention, an input-stage input buffer circuit of a semiconductor integrated circuit includes a transistor having a gate length longer than that specified in the applied design rule. Further, an MOS capacitance constituted by a standard MOS transistor or transistors are added to the input gate of the transistor of the input-stage input buffer circuit. Thereby, the withstand voltage of a surge protection circuit is further raised, and surge protection performance is improved, while an increase in the area occupied by the surge protection circuit on a chip is controlled.

Further, in the present invention, in a semiconductor integrated circuit comprising a gate array system, a predetermined number of transistors having a gate length longer than that specified in the application design rule are formed on a gate array master, together with a plurality of transistors having the standard gate length according to the applicable design rule. In response to requests for different surge withstand voltages, an input-stage input buffer circuit includes a transistor having a gate length longer than that specified in the applicable design rule. Alternatively, a selected number of transistors, having a standard gate length specified in the applicable design rule, are connected as MOS capacitances to the input gate of the transistor of the input-stage input buffer circuit. Thus, the surge withstand voltage of a surge protection circuit is raised, and the surge protection performance of the circuit improved, while the increase of the area occupied by the circuit on a chip is controlled.

Further, in the present invention, in a semiconductor integrated circuit comprising a cell base gate array system, a predetermined number of transistors having a gate length longer than that specified in the applicable design rule are formed in standard cells of a gate array system, together with a plurality of transistors having a standard gate length according to the applicable design rule. In response to requests for different surge withstand voltages, an input-stage input buffer circuit includes a transistor having a gate length longer than that specified in the applicable design rule. Alternatively, a selected number of transistors, having a standard gate length specified in the applicable design rule, are connected as MOS capacitances to the input gate of the transistor of the input-stage input buffer circuit. Thus, the surge withstand voltage of a surge protection circuit is optimized, and the surge protection performance of the circuit improved, while the increase of the area occupied by the circuit on a chip is minimized.

Obviously many modifications and variations of the present invention are possible in the light of the above teachings. It is therefore to be understood that within the scope of the appended claims the invention may by practiced otherwise than as specifically described.

What is claimed is:

1. A semiconductor integrated circuit comprising an input-stage input buffer circuit including a plurality of transistors located on a single semiconductor substrate and having an input terminal, said transistors including an input transistor having a gate connected to said input terminal, the gate of said input transistor having a gate length longer than a gate length specified in a design rule applied in making said semiconductor integrated circuit, some of the transistors having the gate length specified in the design rule.

2. The semiconductor integrated circuit according to claim 1, wherein said input transistor is an MOS transistor.

3. The semiconductor integrated circuit according to claim 1, comprising a second transistor having a gate connected to said input terminal of said input buffer circuit, said second transistor being connected as a capacitance element.

4. The semiconductor integrated circuit according to claim 3, wherein said second transistor is an MOS transistor.

5. The semiconductor integrated circuit of claim 1, wherein the gate of said input transistor is disposed between a pair of gates of said transistors on said semiconductor substrate having a gate length specified in the design rule.

6. A semiconductor integrated circuit comprising a gate array system, said gate array system including a plurality of transistors located on a single semiconductor substrate, said transistors having respective gates, one of said transistors being an input transistor and having a gate connected to an input terminal of said gate array system, some of said transistors having gates with gate lengths in accordance with a design rule applied in making said semiconductor circuit, and said input transistor having a gate with a gate length longer than the length specified in the design rule.

7. The semiconductor integrated circuit according to claim 6, wherein at least one of said transistors in said gate array system is connected as a capacitance element with its gate connected to said gate of said input transistor.

8. The semiconductor integrated circuit of claim 6, wherein the gate of said input transistor is disposed between a pair of gates of said transistors on said semiconductor substrate having a gate length specified in the design rule.

9. A semiconductor integrated circuit comprising a cell base gate array system, said cell base gate array system including a plurality of transistors located on a single semiconductor substrate, said transistors having respective gates, one of said transistors being an input transistor and having a gate connected to an input terminal of said gate array system, some of said transistors having gates with gate lengths in accordance with a design rule applied in making said semiconductor circuit, and said input transistor having a gate with a gate length longer than the length specified in the design rule.

10. The semiconductor integrated circuit according to claim 9, wherein a gate of one of said transistors is connected to said gate of said input transistor as a capacitive element.

11. The semiconductor integrated circuit of claim 9, wherein the gate of said input transistor is disposed between a pair of gates of said transistors on said semiconductor substrate having a gate length specified in the design rule.

* * * * *